(12) United States Patent
Tekumalla et al.

(10) Patent No.: US 6,745,374 B2
(45) Date of Patent: Jun. 1, 2004

(54) ALGORITHMS FOR DETERMINING PATH COVERAGES AND ACTIVITY

(75) Inventors: Ramesh C. Tekumalla, Malden, MA (US); Scott Davidson, Fremont, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 8 days.

(21) Appl. No.: 10/166,904

(22) Filed: Jun. 10, 2002

(65) Prior Publication Data

US 2003/0229488 A1 Dec. 11, 2003

(51) Int. Cl.[7] .............................................. G06F 17/50
(52) U.S. Cl. ................................... 716/4; 716/5; 716/6
(58) Field of Search ............................ 716/4–6, 12–15, 716/16; 703/14–16, 27; 714/741

(56) References Cited

U.S. PATENT DOCUMENTS

| | | | |
|---|---|---|---|
| 5,475,830 A | * 12/1995 | Chen et al. ................... 716/16 |
| 5,654,898 A | * 8/1997 | Roetcisoender et al. ....... 716/9 |
| 5,973,376 A | * 10/1999 | Rostoker et al. ............ 257/401 |
| 6,134,516 A | * 10/2000 | Wang et al. .................. 703/27 |
| 6,209,119 B1 | * 3/2001 | Fukui ............................ 716/2 |
| 6,321,366 B1 | * 11/2001 | Tseng et al. .................... 716/6 |
| 6,353,906 B1 | * 3/2002 | Smith et al. ................. 714/741 |

OTHER PUBLICATIONS

Wang, T.–C.; Wong, D.F., "An optimal algorithm for floor-plan area optimization", Design Automation Conference, 1990. Proceedings. 27th ACM/IEEE, Jun. 24–28, 1990 Page(s): 180–186.*

J. Cong, et al., "General Models and Algorithms For Over–The–Cell Routing in Standard Cell Design", Proc. of 27.sup.th ACM/IEEE Design Automation Conference, pp. 709–715, 1990.*

Donath et al., "Timing Driven Placement Using Complete Path Delays", 27th ACM/IEEE Design Automation Conference, 1990. Paper 6.1, pp, 84–89.*

Chan, "Algorithms for Library–Specific Sizing of Combinational Logic", 27th ACM/IEEE Design Automation Conference, 199 Paper 21.4, pp. 353–356.*

Gharaybeh, M.A. et al. "An exact non–enumerative fault simulator for path–delay faults," ITC 1996: 276–285.

Tragoudas, S. "Accurate path delay fault coverage is feasible," ITC International Test Conference. IEEE 1999:201–210.

* cited by examiner

Primary Examiner—Vuthe Siek
Assistant Examiner—Naum Levin
(74) Attorney, Agent, or Firm—Lahive & Cockfield, LLP

(57) ABSTRACT

An apparatus and method are provided for identifying functionally sensitized data paths in a logic circuit and storing the identified data paths in a representation of the logic circuit. The representation of the logic circuit includes a single occurrence of each identified data path along with a variable for each single name or path segment identified. The variable represents a number of times that path segment or signal name was functionally sensitized.

30 Claims, 6 Drawing Sheets

ALGORITHMS FOR DETERMINING PATH COVERAGES AND ACTIVITY

TECHNICAL FIELD OF THE INVENTION

The present invention generally relates to integrated circuit design, and more particularly, to simulation of a logic circuit design in an integrated circuit.

BACKGROUND OF THE INVENTION

A typical integrated circuit may have a large number of data paths that need to be stored for the purpose of simulating at least a portion of the integrated circuit. A data path in an integrated circuit is referred to as a sequence of leads and gates that create a path from an input node of the logic circuit to an output node of the logic circuit. The data path allows a data value to propagate from the input node to the output of the logic circuit. Unfortunately, the storage and retrieval of the significant number of data paths in the integrated circuit is burdensome. One burden of storing the significant number of data paths is the amount of storage space needed to hold a representation of each of the data paths.

Another burden of storing the significant number of data paths is the time required for looking up and retrieving previously stored data paths. The inability to efficiently store a large number of data paths is a burden to simulating the functional performance of a logic circuit under design. One example of the type of logic fault modeling effected by the inability to efficiently store a large number of data paths is known as Path Delay Fault Modeling. Path Delay Fault Modeling allows an engineer to apply a number of test vectors, a one dimensional array of values, to several input nodes of the logic circuit to determine which of the data paths in the logic circuit fails to propagate a signal transition from an input node to an output node within a specified amount of time. Path Delay Fault Modeling is utilized to simulate logic circuits that do not have scan capability as well as logic circuits that do have scan capability. In logic circuits that do have scan capability, the input node is associated with a first clocked storage element and the output node is associated with a second clocked storage element. The use of Path Delay Fault Modeling requires access to a data structure to store and retrieve the data paths identified as having an amount of delay that requires further analysis by the engineer. Because of the manner in which the data paths are stored, the time needed to retrieve multiple data paths has a linear relationship with the number of data paths to be retrieved. Moreover, because the data paths are not stored in a manner that associates a data path with a functional model or test simulation, it is burdensome for the engineer or program to recall a selected path for evaluation. Consequently, the retrieval of a data path results in a significant computational time burden.

SUMMARY OF THE INVENTION

The present invention addresses the above-described limitations of storing and retrieving data paths of an integrated circuit that have been sensitized by vector simulation. The present invention provides an approach to accelerate the look-up of stored sensitized data paths for use in simulating the functional operation of a selected data path by assigning each identified data path a value. The assigned value provides an indication of how well a particular simulation exercised each of the identified data paths so that an engineer can identify which of the sensitized data paths in the design are candidates for further modeling or simulation.

In one embodiment of the present invention, an apparatus capable of simulating operation of a logic circuit having one or more data paths between one or more input nodes and one or more output nodes provides a method for storing a representation of the logic circuit in a storage device associated with the apparatus. The method provides the steps of identifying each of the data paths in the logic circuit, and assigning an activity value to each of the identified data paths. The assigned activity value indicates the number of times the selected data path propagated a value during a simulation of the logic circuit. The method also provides the steps of creating a representation of the logic circuit based on the identification of each of the data paths and the activity value assigned to each of the data paths. The representation of the logic circuit includes a single occurrence of each of the multiple data paths identified. The method also provides the step of storing the representation of the logic circuit in the storage device.

The apparatus can be instructed to perform the step of determining metrics for the logic circuit based on the identified data paths, the modeling of simulation performed and from the activity values assigned to each identified data path to represent an ability of the simulation to exercise a portion of the logic circuit. The apparatus can also be instructed to apply one or more vectors to one or more input nodes of the logic circuit to identify the data paths that propagate a value for each applied vector and assign an activity factor to the data paths that propagate a value. The activity factor indicates a number of times a selected data path propagated a value for the one or more vectors.

The above described approach benefits an integrated circuit, such as a microprocessor. The assigning of an activity factor or value to each data path and the creation of a representation of the logic circuit that includes a single occurrence of each of the identified data paths significantly reduces the amount of storage needed to store the representation and in the same manner facilitates the retrieval of one or more paths from the representation. The assignment and use of the activity value for each identified data path allows an engineer to recall one or more data paths from a storage device based on the simulation or modeling performed on the logic circuit. In this manner, the engineer can more readily focus a design verification test suite on data paths having design specifications that are critical to the overall operation of the integrated circuit.

In accordance with another aspect of the present invention, an apparatus capable of simulating operation of a logic circuit having one or more data paths between one or more input nodes and one or more output nodes provides a method for creating a data structure that represents at least a portion of the logic circuit. The data structure is held in a storage device associated with the apparatus. The apparatus is instructed to provide the steps of simulating operation of the logic circuit and determining from the simulation which of the one or more data paths is capable of propagating a logic value from an input node to an output node. The method also provides a step of identifying a usage value for each of the one or more data paths capable of propagating the logic value to indicate a number of times the data path propagated the logic value during the simulation operation. The method also provides the step of creating a tree like data structure having a root node for each of the one or more output nodes, and a number of nodes branching from each of the root nodes that represent a discrete data path. The number of nodes branching from each root node equals the number of data paths determined to propagate a logic value from an input node to an output node. The method is also capable of providing steps that determine from the usage value associated with a selected one or more data paths, one or more metric values that represent an ability of a selected simulation or modeling to exercise a portion of the logic circuit.

The above described approach provides the benefit of creating a representation of a logic circuit that can be rapidly traversed while at the same time minimizing an amount of storage needed to store the representation. As such, an engineer is able to use the representation of the circuit to identify data paths having an insufficient amount of activation. The ability to identify data paths with an insufficient amount of activation allows the engineer to target one or more specific data paths having the insufficient amount of activation by developing a customized set of values to exercise the specific data paths in order to provide a more robust design.

In yet another aspect of the present invention, a method is provided for verifying an ability of a simulation to model a functional operation of a logic circuit. The method includes the steps of identifying a set of one or more physical data paths in the logic circuit between an output node and one or more input nodes that are capable of propagating a logic value from the one or more input nodes to the output node. The set of physical data paths includes a single occurrence of each identified physical data path. The method also provides the step of assigning each of the physical data paths in the set a value that indicates an activation factor of the physical data path during the simulation. The value assigned to each of the one or more physical data paths provides an indication of the simulations ability to activate the logic circuit. The method also provides the steps of constructing a data structure to hold a representation of the set of the one or more physical data paths and the value assigned to each of the physical data paths. The method also provides a step of storing the data structure in one or more memory locations of a memory device.

In still another aspect of the present invention, an apparatus is provided for simulating operation of a logic circuit. The apparatus includes a display device for viewing by a user, an input device for use by the user and a simulation facility for simulating operation of the logic circuit. The simulation facility being capable of determining one or more data paths from a start point to an end point of the logic circuit and from the determination of the one or more data paths to construct a representation of the logic circuit. The representation of the logic circuit includes an indicator for each of the one or more data paths that indicate a frequency that the simulation operation functionally exercised a selected data path. The apparatus can also be configured to communicate with a storage device to hold the representation. The storage device can be remote from the apparatus so that communications occur across a network associated with the storage device. The storage device can also be local to the apparatus, that is within the apparatus itself or within close proximity of the apparatus, for example, within the same laboratory or room.

A further embodiment of the present invention provides a readable medium holding device executable instructions for creating a representation of a logic circuit. The readable medium provides the device with instructions to create the representation so that a single occurrence of each identified data path is held in the representation and that for each occurrence of a data path there is an activity factor to provide an to indication how often the selected data path was exercised during the simulation.

BRIEF DESCRIPTION OF THE DRAWINGS

An illustrative embodiment of the present invention will be described below relative to the following drawings.

DETAILED DESCRIPTION

Figure 1:
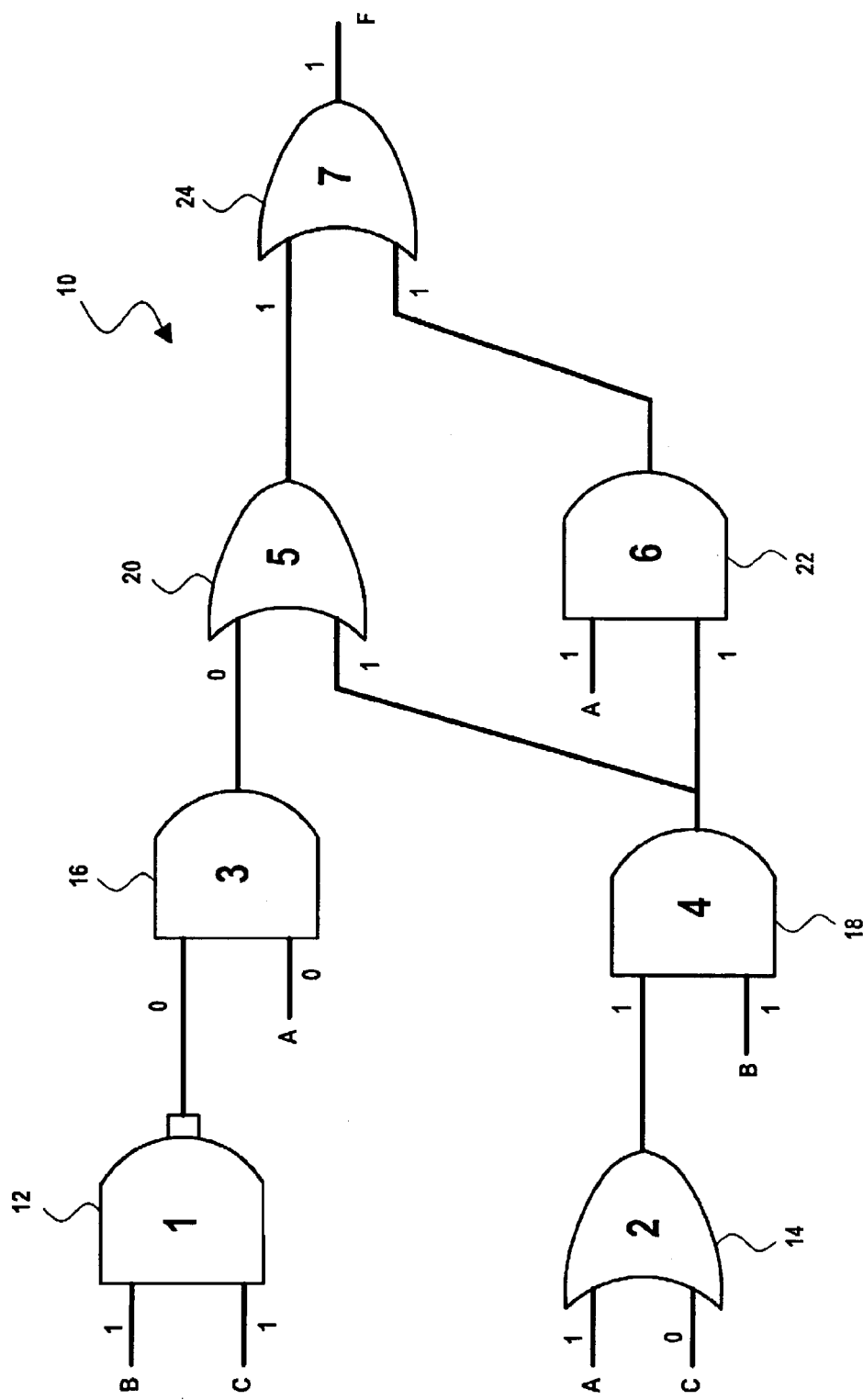
FIG. 1 depicts an exemplary schematic diagram of a logic circuit suitable for use in practicing the illustrative embodiment of the present invention.

The illustrative embodiment of the present invention provides an approach to identifying data paths in a logic circuit that are sensitized by a modeling or simulation of the logic circuit. The data paths are sensitized through the assertion of a vector or a series of vectors on the inputs of the logic circuit. The data paths that are sensitized are used to create a representation the logic circuit that minimizes an amount of storage space needed to store the representation. In the illustrative embodiment, the representation of the logic circuit includes a single occurrence of each identified data path and an activity factor associated with each data path that indicates the number of times the data path is sensitized during a simulation or modeling exercise. The representation of the logic circuit is a tree like structure having a root node for each output node in the logic circuit and where a single data path exists for each leaf node in the tree. Each branch in the tree structure has an associated value that represents an activity factor for that branch.

In the illustrative embodiment, the approach to identifying the one or more data paths and the creation of a representation of the identified data paths is attractive for use in the design of integrated circuits. The representation of the logic circuit allows an engineer to identify portions of the logic circuit that need further activation due to a low activity factor or to identify portions of the logic circuit that need to be enhanced or redesigned based on a unreasonable activity factor, for example, a data path that is unable to support design requirements. The illustrative embodiment allows for the representation of the logic circuit to be stored in a convenient manner that facilitates retrieval of data paths by modeling or simulation type, for example a simulation that exercises only portions of a memory pre-decode and decode circuitry, while minimizing an amount of storage needed to store the representation.

Before continuing with the detailed description it is helpful to first define a few terms as used throughout the specification and claims.

As used herein, the term "activity factor" or the term "activity value" or the term "activation" refers to the number of times a data path is sensitized during a simulation, a modeling or a test of the logic circuit.

As used herein, the term "data path" refers to a sequence of leads and gates that create a data path from an input node to an output node of the logic circuit. A lead at a gate G on a data path is an on-path input of the data path while all other inputs of G are side inputs of the path.

As used herein, the term "controlling value" or "controlling value of a gate G" refers to a value that, when applied to one of the gate inputs, controls the gate output regardless of the values on the gates other inputs. For example, the controlling value of an AND gate is a logic "0".

As used herein, the term "functionally sensitized" or "sensitized" refers to a data path that propagates a value from a vector asserted on an input node of the logic circuit.

FIG. 1 depicts an exemplary circuit 10 suitable for use in practicing the illustrative embodiment of the present invention. Those skilled in the art will recognize that the exemplary logic circuit 10 is merely meant to facilitate explanation of the illustrative embodiment of the present invention and is not meant to be limiting in any way or manner. Nevertheless, those skilled in the art will recognize that the configuration of logic circuit suitable for use in practicing the illustrative embodiment of the present invention is near limitless.

As FIG. 1 illustrates, NAND gate 12 is a two input logic gate having a first input coupled to input node B and a second input coupled to input node C. The output of NAND gate 12 is coupled to a first input of AND gate 16, which has a second input coupled to input node $\overline{A}$. The output of AND gate 16 is coupled to a first input of OR gate 20. The second input of OR gate 20 is coupled to the output of, gate 18 and an input of, AND gate 22. The output of OR gate 20 is coupled to a first input of OR gate 24. The second input of OR gate 24 is coupled to the output of AND gate 22. The output of OR gate 24 is coupled to output node F. A second input of AND gate 22 is coupled to input node A. A first input of AND gate 18 is coupled to input node B and a second input of AND gate 18 is coupled to the output of OR gate 14. A first input of OR gate 14 is coupled to input node A and a second input of OR gate 14 is coupled to input node C.

During simulation of the exemplary logic circuit 10 one or more vectors are asserted on input nodes A, B, C, $\overline{A}$ and $\overline{C}$. The illustration of the exemplary logic circuit 10 in FIG. 1 illustrates the assertion of a vector having an A value equal to logic "1", a B value equal to logic "1" and a C value equal to logic "1". Those skilled in the art will recognize that the vector values utilized are merely illustrative and that a number of vector values can be selected to functionally exercise the exemplary logic circuit 10. FIG. 1 also illustrates the values that are propagated along the various data paths of the exemplary logic circuit 10 using the vector having an A value equal to a logic "1", a B value equal to a logic "1" and a C value equal to a logic "1". The further numbering of each gate FIG. 1, numbers 1 through 7, illustrates that a gate in the exemplary logic circuit 10 can correspond to a node in a tree like structure that is representative of the exemplary logic circuit 10. The correlation between the identified logic gates, numbers 1 through 7, and the corresponding numbered node in the tree like representation illustrated in FIG. 2 are discussed below in more detail with reference to FIG. 2.

Figure 2:
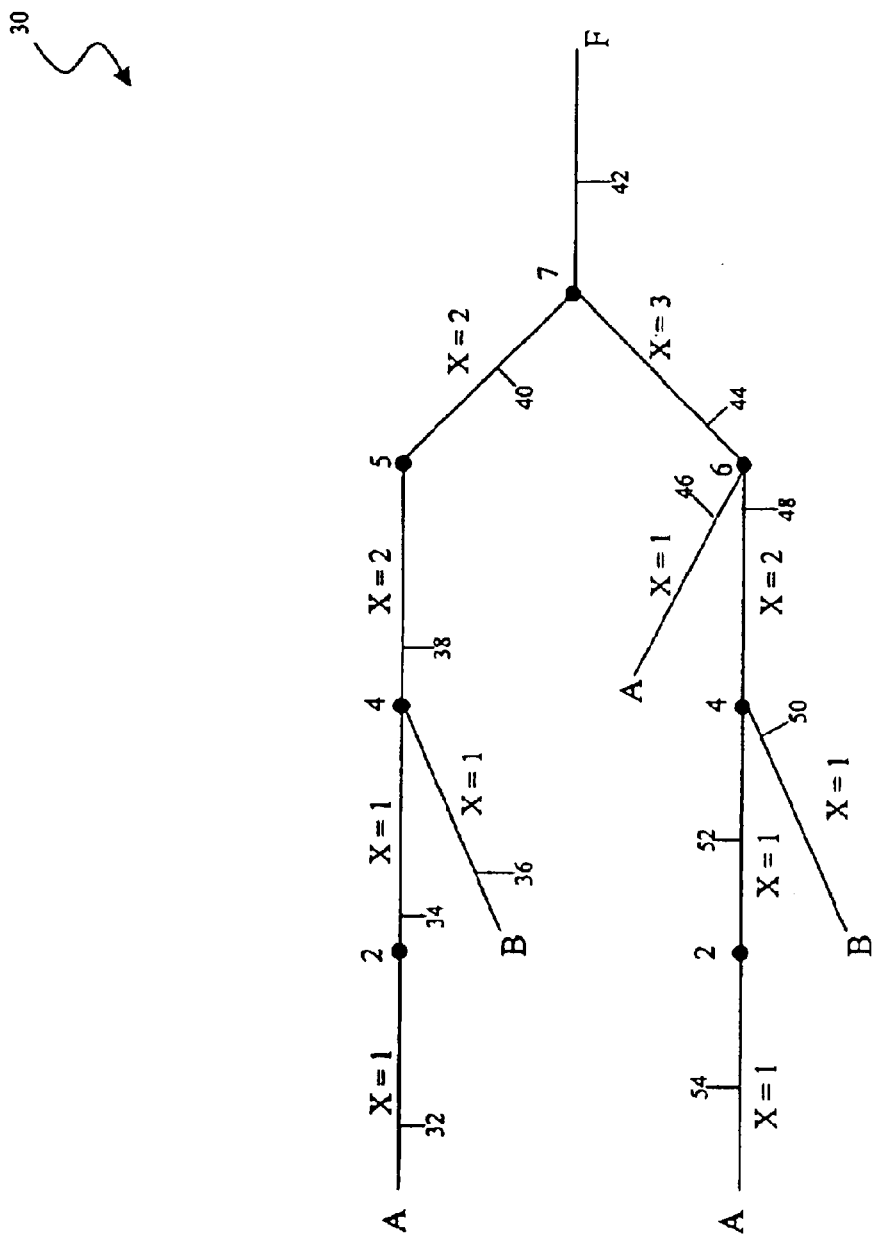
FIG. 2 illustrates a representation of the schematic depicted in FIG. 1 that is capable of being created by the illustrative embodiment of the present invention.

FIG. 2 illustrates a tree like representation 30 of the exemplary logic circuit 10. The tree like representation 30 is organized as a single hierarchical tree per output node of the exemplary logic circuit 10 as depicted in FIG. 2. That is, if there was a second output node in the exemplary logic circuit 10 there would be a corresponding tree like representation for the second output node. Nevertheless, one skilled in the art will recognize that the tree configuration shown in FIG. 2 is for illustrative purposes only and that an actual tree configuration can differ significantly from the illustrated configuration without departing from the scope and principles of the present invention. Moreover, the creation of the tree like representation 30 provides only one path from each leaf node and includes variable defined as an activity factor that is assigned to a path segment that identifies the number of times that path segment is functionally sensitized by the test, simulation, vector, vector set or suite.

The tree like representation 30 is implemented as a plurality of linked records. Each node in the tree like representation 30 is associated with a record having several fields or attributes. The nodes or records are linked using pointers. Each record includes an array of pointers that point to other memory locations holding a record for a child node or holding additional information on where the record or fields for the child node is located in the memory device. Each node or record includes additional attributes for data relating to a type of logic gate the node represents, for example an AND gate. Other attributes in each node or record include an output signal name for that node, an input signal name for each input of the gate, an integer variable associated with each sensitized data path that identifies the activity factor for an output signal of the node. Those skilled in the art will recognize that each node in the tree like structure can be adapted to include additional attributes as required. Moreover, those skilled in the art will recognize that the tree like representation 30 can also be implemented in an object oriented database having defined classes and subclasses that represent the results of a simulation or modeling test suite.

A depth first search from each output node, or clocked storage element, to an input node, or clocked storage element is performed in the exemplary logic circuit 10 to create the tree like representation 30. The depth first search determines all possible data paths for a vector value to propagate from an input node to an output node of the exemplary logic circuit 10. The depth first search is a recursive process that begins at output node F and traces back through each gate to an input node, such as nodes A, B, C, $\overline{A}$ and $\overline{C}$. The recursive process of the depth first search of the exemplary logic circuit 10 indicates that there are ten possible data paths branching from the output node F to the various input nodes, as illustrated in FIG. 1. After determining the total number of paths in the exemplary logic circuit 10, one or more vectors are asserted on the input nodes A, B, C, $\overline{A}$, and $\overline{C}$ to determine the functionally sensitized data paths for each vector. FIG. 2 illustrates, by the tree like representation 30, the functionally sensitized data paths in the exemplary logic circuit 10 for a vector having an A value of a logic "1", a B value of a logic "1", and a C value of a logic "1".

In more detail, the tree like representation 30 illustrates that five data paths are functionally sensitized when a vector having an A value, a B value and a C value all equal to a logic "1" are asserted on the inputs of the exemplary logic circuit 10. A first sensitized path is defined by a path segment 42 formed between the output node F and node 7, a path segment 44 formed between node 7 and node 6, and path segment 46 formed between node 6 and input A. Those skilled in the art will recognize that node 7 in FIG. 2 corresponds to OR gate 24 in FIG. 1, node 6 in FIG. 2 corresponds to AND gate 22 in FIG. 1, and that other like node numbers correspond to other like numbered gates illustrated in FIGS. 1 and 2. The tree like representation 30 of the exemplary logic circuit 10 also includes an activity factor or activity value associated with each segment of the functionally sensitized data path. For example, path segment 44 has an activity factor X equal to 3 while path segment 46 has an activity factor X equal to 1. The determination of the activity factor is discussed below in more detail.

Other functionally sensitized path segments include a second functionally sensitized data path that includes the path segment 42 formed between output F and node 7, the path segment 44 formed between node 7 and node 6, the path segment 48 formed between node 6 and node 4, and path segment 50 formed between node 4 and input B. A third functionally sensitized data path is defined by the path segment 42 formed between the output F and node 7, the path segment 44 formed between node 7 and node 6, the path segment 48 formed between node 6 and node 4, a path segment 52 formed between node 4 and node 2, and a path segment 54 formed between node 2 and input A. A fourth functionally sensitized data path is defined by the path segment 42 formed between output node F and node 7, a path segment 40 formed between node 7 and node 5, a path segment 38 between node 5 and node 4, and path segment 36 between node 4 and input B. A fifth functionally sensitized data path is defined by the path segment 42 formed between the output F and node 7, the path segment 40 formed between node 7 and node 5, the path segment 38 formed between node 5 and node 4, a path segment 34 formed between node 4 and node 2, and a path segment 32 formed between node 2 and input A.

Figure 3:
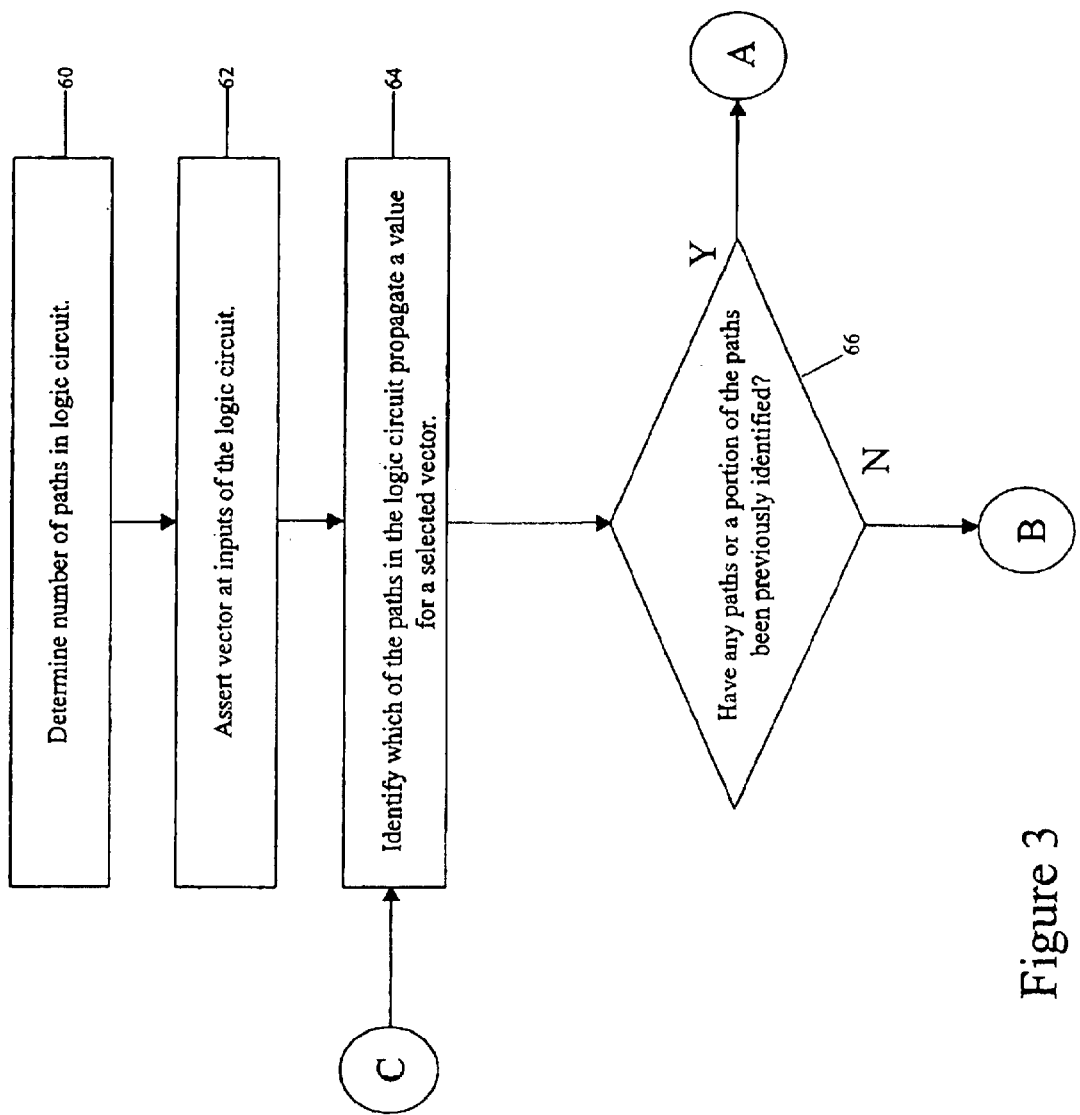
FIG. 3 illustrates a flow diagram that depicts steps taken by the illustrative embodiment of the present invention to create the representation in FIG. 2.
Figure 4:
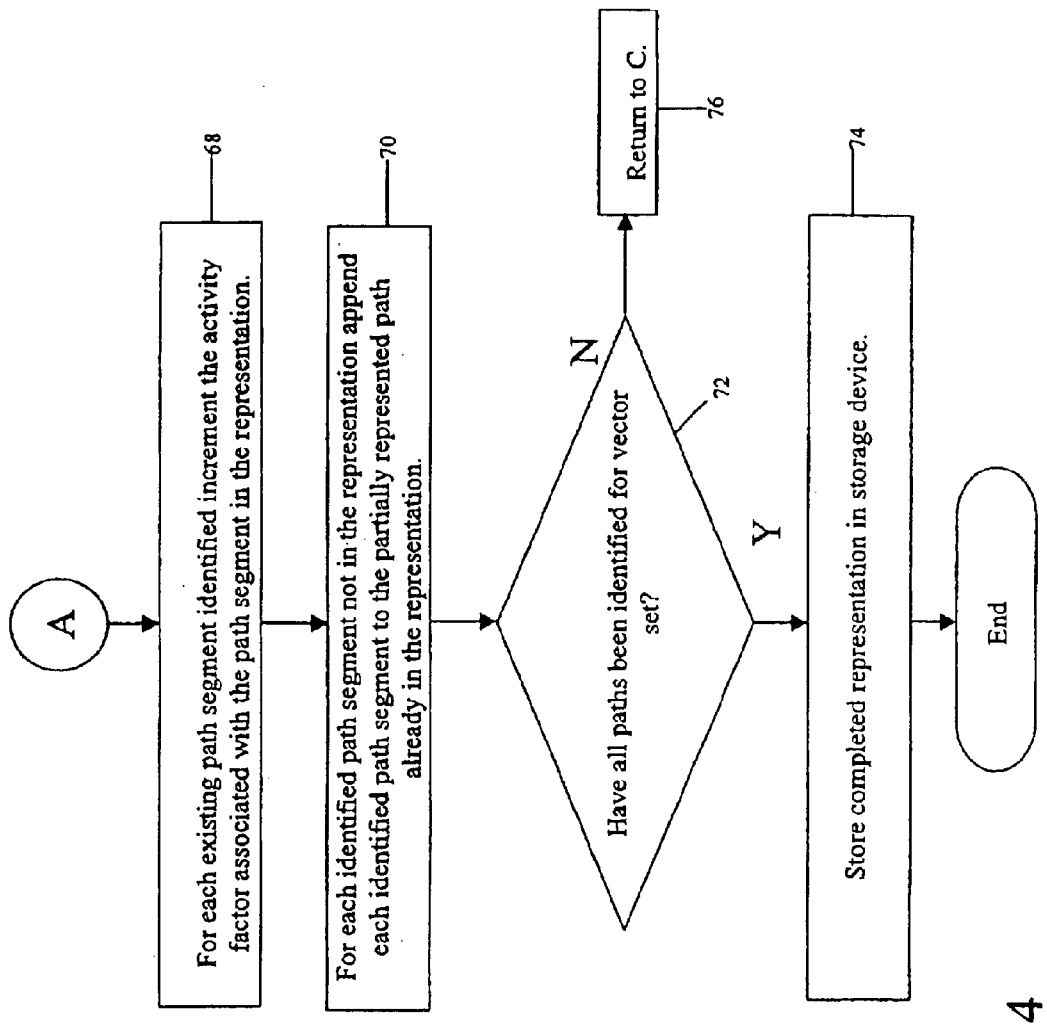
FIG. 4 is a continuation of the flow diagram depicted in FIG. 3.
Figure 5:
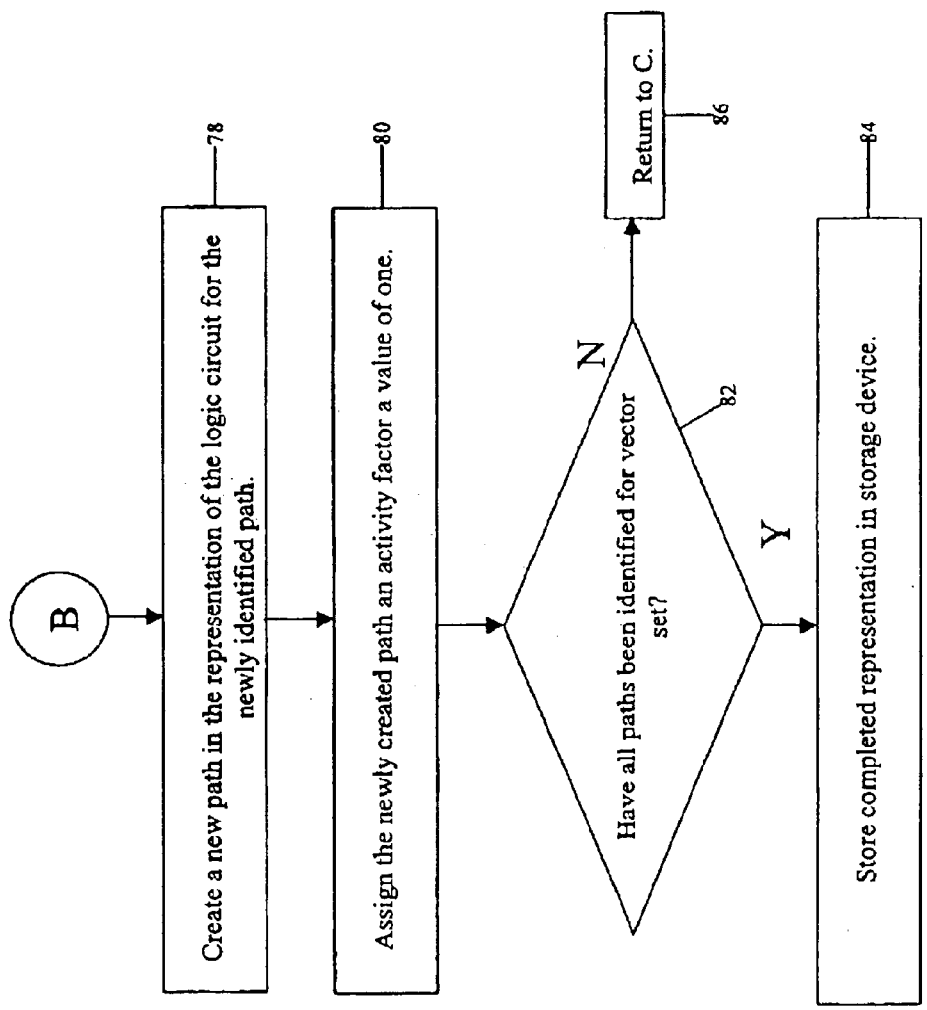
FIG. 5 is a continuation of the flow diagram depicted in FIG. 3.

FIGS. 3, 4 and 5 illustrate the steps taken to identify the functionally sensitized paths of the exemplary logic circuit 10 for a particular vector and the creation of the tree like representation 30. To begin the formation of the tree like representation 30, a depth first analysis is performed on the exemplary logic circuit 10 to first determine the total number of data paths in the circuit (step 60 in FIG. 3). The depth first analysis is a recursive process that works back from each output node in the logic circuit to each input node in the logic circuit to identify each possible data path a data value can propagate along between the selected output node and the input nodes of the logic circuit. Those skilled in the art will recognize that the selected output node can be a clocked storage element or an output node of a combinational circuit and that the input node can be a clocked storage element or an input node of a combinational circuit. Once the total number of data paths in the logic circuit are determined, a vector is asserted at the inputs of the logic circuit to determine which of the data paths are functionally sensitized for the asserted vector (step 62 in FIG. 3). Once the vector is asserted and the values are propagated through the logic circuit, the number of functionally sensitized data paths for that vector are determined and are utilized to create the representation of the logic circuit in the tree like representation 30 (step 64 in FIG. 3). Initially, the tree like representation 30 of the exemplary logic circuit 10 is empty and the first sensitized path is stored in the tree with each path segment assigned an activity factor or value set to one. For each functionally sensitized data path determined for a particular vector, the tree like representation 30 of the exemplary logic circuit 10 is first checked to determined if that functionally sensitized data path already exists in the representation (step 66 in FIG. 3).

If the functionally sensitized data path or a portion of the functionally sensitized data path exists in the tree like structure 30, the activity factor associated with the path segments that exist in the tree like structure are incremented by one (step 68 in FIG. 4). The portion of the functionally sensitized data path that does not exist in the tree like data structure 30 is appended to the existing partial path in the tree like structure 30 with each appended path segment having an initial activity factor assigned a value of one (step 70 in FIG. 4). In this manner, the path segments that are utilized by more than one functionally sensitized data path are not duplicated in the tree like representation 30, which, in turn, reduces the amount of storage space necessary to store the tree like structure and, in turn, facilitates retrieval of a selected functionally sensitized data path from a storage device. If all functionally sensitized data paths have been identified for a vector set (step 72 in FIG. 4), the tree like representation 30 is stored in a storage device (step 74 in FIG. 4). If all the functionally sensitized data paths have not been identified for the vector set (step 72 in FIG. 4), the method in step 76 of FIG. 4 returns to step 64 in FIG. 3.

If after asserting a vector at the input nodes of the exemplary logic circuit 10 one or more functionally sensitized data paths have not been previously identified (step 66 in FIG. 3), a new path is created in the tree like representation 30 that represents the newly identified data path (step 78 in FIG. 5). Each path segment in the newly identified data path is initially assigned an activity factor value of one (step 80 in FIG. 5). If all of the functionally sensitized data paths have been identified (step 82 in FIG. 5) then the tree like representation 30 is stored in a storage device (step 84 in FIG. 5). If there are functionally sensitized data paths that remain to be identified and made part of the tree like representation 30 the process returns to step 64 in FIG. 3 (step 86 in FIG. 5).

The representation of the tree like structure 30 provides a significant benefit, for at the end of a simulation, modeling or testing of the logic circuit every functionally sensitized path in the logic circuit can be uniquely identified from the tree like representation 30 by test name, test type or the like. The ability to assign an activity factor or value to each path segment of each functionally sensitized data path provides an engineer with an additional tool for evaluating operational performance of the logic circuit, the simulation, the modeling, or a combination thereof. From the assigned activity factors the engineer is able to generate one or more metrics to assist in evaluating operation performance of the logic circuit or the simulation suite. For example, the engineer is able to determine from the activity factors a toggle coverage metric, which indicates how many nodes in the logic circuit toggled under certain conditions. A further example is a transition coverage metric that allows the engineer to determine, which vector set causes a transition to occur on one or more data paths. Additional metrics include a path coverage metric that allows the engineer to determine, which data path was exercised by which simulation test and also determine the number of data paths exercised out of the total number of data paths identified. Those skilled in the art will recognize that other metrics can be generated from the data held by the tree like representation 30 that allow an engineer or other like professional to evaluate the performance of the logic circuit or the simulation suite exercising the logic circuit or a combination thereof.

Figure 6:
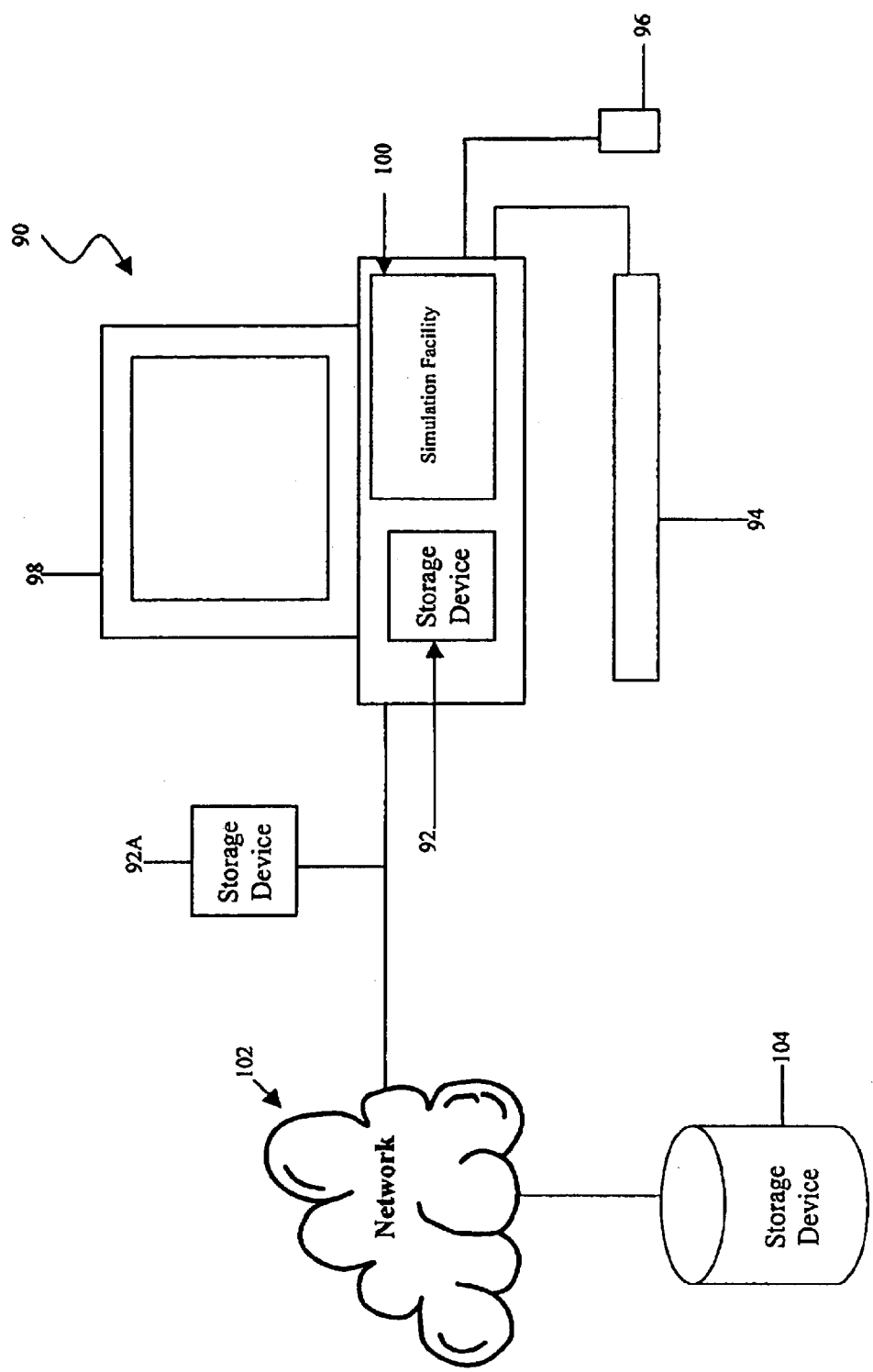
FIG. 6 depicts a block diagram of an apparatus suitable for practicing the illustrative embodiment of the present invention.

FIG. 6 illustrates an apparatus 90 suitable for simulating functional operability of the exemplary logic circuit 10 and for creating the tree like representation 30. The apparatus 90 includes a display 98 to display the tree like representation 30, a keyboard 94 and a pointing device 96, such as mouse, light pen or other like pointing device. The apparatus 90 also includes a storage device 92 such as a hard drive or an optical drive that can read or write to an optical disk, and a simulation facility 100. The simulation facility 100 is capable of performing the depth first search to identify all possible data paths in the logic circuit under simulation and then apply the various vectors in the vector set to identify each functionally sensitized data path for each vector in the vector set. The simulation facility 100 also creates the tree like representation 30 by the identification of each functionally sensitized data path for each vector asserted as described above.

The apparatus 90 is adaptable to be in communication with a network 102, which can be a LAN, a WAN, a long haul network, the Internet, an intranet or other like network that is considered wired, wireless, or a hybrid of wired and wireless. Communication between the apparatus 90 and the network 102 can be through one or more wire or cable mediums, or with a wireless medium using terrestrial or satellite communications, or a combination thereof. The apparatus 90 is able to utilize the network 102 to communicate with a remote storage device 104 to store or retrieve the creation of the tree like representation 30. The use of the remote storage device 104 allows for use of the tree like representation 30 by multiple users associated with the network 102 or for storage at a data center for archiving purposes or for other like purposes. The apparatus 90 is also able to communicate with a local storage device 92A located externally to the apparatus 90, but in relatively close proximity thereto The local storage device 92A can be a server or optical jukebox located in close proximity to the apparatus 90, for example, in the same laboratory or same floor, or same building and not associated with the network 102 for security reasons. In this manner, the apparatus 90 can utilize the storage capability of the remote storage device 92A to store the created tree like representation 30 in a highly secure manner.

While the present invention has been described with reference to a preferred embodiment thereof, one skilled in the art will appreciate various changes in form and detail may be made without departing from the intended scope of the present invention as defined in the pending claims. For example, the initial value of the activity factor or value may be set to zero or that a discrete tree like structure can be created for each vector in a vector set. Moreover, the present invention is applicable to logic circuits with scan capability, as well as, logic circuits without scan capability. Furthermore, those skilled in the art will recognize that in logic circuits with scan capability, an input node refers to a first clocked storage element and an output node refers to a second clocked storage element.

What is claimed is:

1. In an apparatus capable of simulating operation of a logic circuit having one or more data paths between one or more input nodes and one or more output nodes, a method for storing a representation of at least a portion of the logic circuit in a storage device associated with the apparatus, the method comprising the steps of:

assigning an activity value to each identified one or more path segments for each identified data path, the activity value indicating a number of times a selected segment of the one or more data paths propagated a value during a simulation of the logic circuit;

creating a representation of at least a portion of the logic circuit, the representation identifying which of the one or more data paths identified propagated a value during a simulation of the logic circuit and identifying the activity value assigned to each path segment forming the one or more data paths, the representation of at least a portion of the logic circuit having a single occurrence of each of the one or more data paths identified; and storing the representation of the logic circuit in the storage device.

2. The method of claim 1, further comprising the step of, applying one or more vectors to the one or more input nodes so that one or more values from each of the one or more vectors propagate through the logic circuit from the one or more input nodes to the one or more output nodes to identity the one or more data paths in the logic circuit.

3. The method of claim 1, wherein the step of identifying each of the one or more data paths in the logic circuit comprises the step of:

traversing the logic circuit from the one or more output nodes to the one or more input nodes to identify the one or more data paths in the logic circuit; and asserting a vector on the one or more input nodes of the logic circuit to identify which of the one or more data paths propagates a value from the one or more input nodes to the one or more output nodes for the vector.

4. The method of claim 1, wherein the one or more output nodes comprise a clocked storage element.

5. The method of claim 1, wherein the one or more input nodes comprise a clocked storage element.

6. In an apparatus capable of simulating operation of a logic circuit having one or more data paths between one or more input nodes and one or more output nodes, a method for creating at least one data structure that represents at least a portion of the logic circuit, the data structure is held in a storage device associated with the apparatus, the method comprising the steps of:

simulating functional operation of the logic circuit using the apparatus;

determining from the simulation of the logic circuit which of the one or more data paths is capable of propagating a logic value from one of the one or more input nodes to one of the one or more output nodes for a given input vector;

identifying, for each of the one or more data paths capable of propagating the logic value, a usage value that indicates a number of times the data path propagated the logic value during the simulation operation; and creating a data structure having a root node for each of the one or more output nodes, a number of nodes associated with each of the root nodes, and the usage value associated with each of the number of nodes that indicates said number of times the data path propagated the logic value during the simulation operation.

7. The method of claim 6 further comprising the step of, storing the data structure in one or more memory locations in the storage device.

8. The method of claim 6 further comprising the step of determining from the usage value associated with a selected one of the one or more data paths, one or more metric values that represent an ability of a selected simulation to exercise at least a portion of the logic circuit.

9. The method of claim 6 further comprising the step of applying one or more vectors to the one or more input nodes so that each of the vectors propagate through the logic circuit from the one or more input nodes to the one or more output nodes to exercise the one or more data paths in the logic circuit.

10. The method of claim 6, wherein each of the one or more data paths represents a set of input leads for a plurality of logic gates and the plurality of logic gates capable of performing a plurality of logic operations.

11. The method of claim 6, wherein the one or more input nodes comprise a clocked storage element.

12. The method of claim 6, wherein the one or more output nodes comprise a clocked storage element.

13. A method for verifying an ability of a simulation to model a functional operation of a logic circuit, the method comprising the steps of:

identifying a set of one or more physical data paths in the logic circuit between an output node and one or more input nodes that are capable of propagating a logic value from the one or more input nodes to the output node, the set including a single occurrence of each identified physical data path; and assigning to each path segment that forms the one or more physical data paths in the set a value that indicates a usage factor for that path segment of the one or more physical data paths during the simulation, the value assigned to each of the path segments forming the one or more physical data path provides an indicator for use in verification of the simulation to model the logic circuit.

14. The method of claim 13 further comprising the step of, asserting one or more vector sets on the one or more input nodes to define the one or more physical data paths.

15. The method of claim 14 further comprising the step of generating one or more metrics from data held by the data structure to evaluate the ability of the one or more vector sets to of exercise the logic circuit.

16. The method of claim 15, wherein the one or more metrics comprise:
a toggle coverage metric that indicates how many of the path segments in each of the physical data paths toggle during the simulation;
a transition coverage metric that indicates which of the path segments in each of the physical data paths transition from a first state to a second state following assertion of a new vector set on the one or more input nodes during the simulation; and
a path coverage metric that indicates which of the path segments in each of the physical data paths was utilized to form one of the one or more physical data paths during the simulation and a number of times each of the path segments was utilized to form one or more of the physical data paths during the simulation.

17. The method of claim 13 further comprising the steps of:
constructing a data structure to hold a representation of the set of the one or more physical data paths identified and the value assigned to each of the path segments that form each of the physical data paths in the set; and
storing the data structure in one or more memory locations of a memory device.

18. The method of claim 17, wherein the representation of each of the one or more physical data paths comprises, a tree structure having one or more nodes, wherein each of the nodes the tree structure, represents one of the one or more interconnected intermediate nodes.

19. The method of claim 13, wherein each of the path segments represents at least a logic gate assembly capable of performing a logic operation.

20. An apparatus for simulating operation of a logic circuit, the apparatus comprising:
a display device for viewing by a user;
an input device for use by the user; and
a simulation facility for simulating operation of the logic circuit, the simulation facility comprising the steps of:
identifying a set of one or more physical data paths in the logic circuit between an output node and one or more input nodes that are capable of propagating a logic value from the one or more input nodes to the output node, the set including a single occurrence of each identified physical data path; and
assigning to each path segment that forms the one or more physical data paths in the set a value that indicates a usage factor for that path segment of the one or more physical data paths during the simulation, the value assigned to each of the path segments forming the one or more physical data path provides an indicator for use in verification of the simulation to model the logic circuit.

21. The apparatus of claim 20, wherein the simulation facility further comprises a step of, constructing a representation of the logic circuit that includes the value assigned to each path segment that forms the one or more physical data paths in the set.

22. The apparatus of claim 21, further comprising a storage device in communication with the apparatus for holding the representation of the one or more data paths.

23. The apparatus of claim 21, wherein the representation of the logic circuit comprises, a data structure having at least a root node and one or more nodes associated with said root node.

24. The apparatus of claim 20, wherein the output node of the logic circuit comprises a clocked storage element in the logic circuit.

25. The apparatus of claim 20, wherein the one or more input nodes comprise one or more clocked storage elements.

26. A device readable medium holding executable instructions for an electronic device for simulating operation of a logic circuit having one or more data paths between one or more input nodes and one or more output nodes and for storing a representation of at least a portion of the logic circuit in a storage device associated with the apparatus, the device readable medium holding executable instructions for an electronic device comprising the steps of:
identifying each of the one or more data paths in the logic circuit;
assigning an activity value to each path segment forming the data paths identified, the activity value indicating a number of times a selected path segment of the one or more data paths propagated a value during a simulation of the logic circuit;
creating a representation of at least a portion of the logic circuit based on the identification of each of the data paths and the activity value assigned to each of the path segments forming the data paths, the representation of at least a portion of the logic circuit having a single occurrence of each of the one or more data paths identified; and
storing the representation of the logic circuit in the storage device.

27. The device readable medium holding executable instructions for an electronic device of claim 26 further comprising the step of, determining from the activity value associated with each of the path segments forming the one or more data paths one or more metrics that represent an ability of one or more vector sets to exercise at least a portion of the logic circuit.

28. The device readable medium holding executable instructions for an electronic device of claim 26 further comprising the step of; applying one or more vectors to the one or more input nodes so that one or more values from each of the one or more vectors propagate through the logic circuit from the one or more input nodes to the one or more output nodes to identify which of the one or more data paths in the logic circuit is sensitized by the vector.

29. The device readable medium holding executable instructions for an electronic device of claim 26, wherein the step of identifying each of the one or more data paths in the logic circuit comprises the step of:
traversing the logic circuit from the one or more output nodes to the one or more input nodes to identify all of the one or more data paths in the logic circuit; and
asserting a vector on the one or more input nodes of the logic circuit to identify which of the one or more data paths propagates a value from the one or more input nodes to the one or more output nodes for the vector.

30. The device readable medium holding executable instructions for an electronic device of claim 26, wherein the one or more output nodes comprise a clocked storage element.

* * * * *